United States Patent [19]

Prussas et al.

[11] Patent Number: 4,689,719

[45] Date of Patent: Aug. 25, 1987

[54] HOUSING-FREE VERTICALLY INSERTABLE SINGLE-IN-LINE CIRCUIT MODULE

[75] Inventors: Herbert Prussas; Peter Stern, both of Munich, Fed. Rep. of Germany

[73] Assignee: Siemens Aktiengesellschaft, Berlin and Munich, Fed. Rep. of Germany

[21] Appl. No.: 724,491

[22] Filed: Apr. 18, 1985

Related U.S. Application Data

[60] Division of Ser. No. 628,307, Jul. 6, 1984, abandoned, which is a continuation of Ser. No. 300,499, Sep. 9, 1981, abandoned.

[30] Foreign Application Priority Data

Sep. 25, 1980 [DE] Fed. Rep. of Germany ....... 3036196
May 29, 1981 [DE] Fed. Rep. of Germany ....... 3121515
Jun. 11, 1981 [DE] Fed. Rep. of Germany ....... 3123201

[51] Int. Cl.$^4$ .............................................. H05K 7/20
[52] U.S. Cl. .................................. 361/386; 361/405; 361/412
[58] Field of Search ................... 357/81, 82; 361/386, 361/387, 388, 398–400, 405, 412, 413, 417, 419, 395; 174/52 PE, 16 HS; 165/80 A, 80 B, 80 D, 185

[56] References Cited

U.S. PATENT DOCUMENTS

| 3,020,510 | 2/1962 | Kuch ................... | 361/413 |
|---|---|---|---|
| 3,059,152 | 10/1962 | Khouri ................ | 361/405 |
| 3,280,378 | 10/1966 | Brady ................. | 361/405 |
| 3,437,882 | 4/1969 | Cayzar ................ | 361/413 |
| 3,616,533 | 11/1971 | Heap .................. | 361/387 |
| 3,694,703 | 9/1972 | Wilens . | |
| 3,973,817 | 8/1976 | Stalley ............... | 361/413 |
| 4,107,760 | 8/1978 | Zimmer ............... | 361/412 |
| 4,109,298 | 8/1978 | Hanni ................. | 361/412 |
| 4,124,864 | 11/1978 | Greenberg . | |
| 4,203,147 | 5/1980 | Gabr .................. | 361/395 |

FOREIGN PATENT DOCUMENTS

| 1243254 | 6/1967 | Fed. Rep. of Germany . |
|---|---|---|
| 2165649 | 7/1973 | Fed. Rep. of Germany . |
| 7434817 | 1/1975 | Fed. Rep. of Germany . |
| 2344145 | 3/1975 | Fed. Rep. of Germany . |
| 2815776 | 10/1978 | Fed. Rep. of Germany . |
| 2806518 | 8/1979 | Fed. Rep. of Germany . |
| 2414297 | 1/1980 | Fed. Rep. of Germany . |
| 2014786 | 8/1979 | United Kingdom . |

OTHER PUBLICATIONS

Cooling Conduction Structure for S-C Package, Mansuria, IBM Tech. Discl. Bull., vol. 23, No. 12, May 1981, pp. 5403.

Module with Internal Elements . . . Resistance, Arnold, IBM Tech. Discl. Bull., vol. 21, No. 4, Sep. 1978, pp. 1473.

*Handbook of Electronic Packaging*, Charles A. Harper, Editor, McGraw-Hill Book Company, 1969, pp. 9-75 to 9-83.

*Primary Examiner*—G. P. Tolin
*Attorney, Agent, or Firm*—Hill, Van Santen, Steadman & Simpson

[57] ABSTRACT

A housing-free, vertically insertable single-in-line circuit module has a carrier consisting of synthetic film or ceramic which carries a series of metal terminal pins and one or more electrical components including at least one integrated semiconductor circuit element, and associated conductor runs connecting the circuit element to the terminals, and the carrier has one lateral face thereof which is substantially covered by a metallic cooling sheet for permitting improved cooling of the circuit module by convection.

20 Claims, 18 Drawing Figures

HOUSING-FREE VERTICALLY INSERTABLE SINGLE-IN-LINE CIRCUIT MODULE

REFERENCE TO RELATED APPLICATIONS

This is a division of U.S. Ser. No. 628,307, filed July 6, 1984, which is now abandoned and was a continuation of U.S. Ser. No. 300,499, filed Sept. 9, 1981, now abandoned.

BACKGROUND OF THE INVENTION

The present invention relates to electronic circuit modules for carrying one or more integrated semiconductor circuit elements or "chips" thereon as well as for carrying resistance tracks and/or resistance surfaces. Specifically, the present invention relates to such an electronic circuit module which has a cooling sheet which substantially covers one lateral surface of the module for permitting improved cooling of the module by convection.

Housing-free, vertically insertable single-in-line circuit modules are generally known to those skilled in the relevant technology. Such conventional modules have carriers which may consist, for example, of synthetic film or ceramic and the carriers for such modules generally carry a series of metal terminal pins in the carrier plane which serve as external terminals for insertion of the module into a circuit board, and carry as well one or more electrical components, including at least one integrated housing-free semiconductor circuit element or chip, or a resistance track or resistance surface, and integrated circuit runs which connect the semiconductor element to respective metal terminals.

By virtue of being vertically insertable, such modules have the advantage of permitting ventilation on both sides of the carrier, and thus the components and conductor runs disposed thereon, so that the circuit module and the components carried thereon are sufficiently cooled thus permitting a relatively heavy density of components and relatively high currents to be employed on the module. This is of particular significance for reliable operation of the components especially due to the temperature dependence of resistances resulting from resistance tracks and in the integrated circuit elements. Encoder/decoder chips, for example, are known to be especially sensitive to temperature fluctuations and require that attention be paid to cooling such chips in order to insure operation within specified tolerance ranges.

The use of such vertically insertable single-in-line modules has the further advantage of improving the mechanical stability of the circuit board into which the modules are inserted as a result of the inherent stiffness and stability of the vertically-oriented carrier. Such modules, when inserted in the circuit board, function as a stiffening rib for the circuit board, particularly when such circuit modules are vertically inserted into both sides of the circuit board. This is an advantage when the circuit board experiences a high current load or is exposed to another source of heat because the vertical modules can have a length substantially greater than conventional dual in-line modules. This stiffens the circuit board over a larger area than is possible with dual-in-line modules and thus prevents arcing and sagging of the circuit board in addition to the above-mentioned improved cooling which is obtainable with such vertical modules, in contrast to dual-in-line modules.

In general, such vertical single-in-line modules have the further advantages enumerated below. The modules permit attachment of a few additional discrete electrical components such as, for example, devices for smoothing dc voltages, resistors and capacitors to the front as well as to the back of the carrier. The vertical modules permit the length of conductor runs directly at the circuit module to be relatively short, thus permitting use of the circuit module in particularly high frequency environments. Such vertical single-in-line modules further permit relatively easy testing of the integrated semiconductor circuit element carried thereon under dynamic field conditions such as, for example, at high operating frequencies. The modules of this type can be inserted and soldered to the circuit board relatively easily and can be stored in a space-saving manner before such attachment to the circuit board.

Such modules exhibit the further advantages of permitting relatively easy removal of any integrated semiconductor circuit elements on the modules which, after dynamic testing, are found to be defective in some manner and replacement of the removed component by a new or different component. Because of the absence of a housing, the semiconductor circuit elements on the vertical module are easily cooled and thus exhibit significantly decreased operational changes due to local overheating. The vertical circuit modules permit shaping of the module including through-plating between lines on opposite sides of the module, with comparative ease, particularly by means of cutting, stamping, boring and laser operations. These advantages are particularly pronounced when the carrier consists, for example, of polyimide. The conductor lines on the module can be manufactured by conventional photolithographic technology such as, for example, thin film technology. The carrier can be made very thin, thus presenting space-saving and material-saving advantages because the carrier remains substantially mechanically stable, particularly when the carrier consists of a synthetic material. The ability to construct the carrier with a small thickness also adds to the improved cooling of the components and lines on the carrier by convection, not only by air directly passing over the components, but also by air passing over the opposite side of the carrier.

SUMMARY OF THE INVENTION

It is an object of the present invention to provide a vertically insertable housing-free single-in-line circuit module which retains the advantages of conventional single-in-line circuit modules and which has improved components cooling characteristics.

The above object is inventively achieved in a housing-free vertically insertable single-in-line circuit module which has a plurality of metal terminal pins at a bottom thereof and one or more semiconductor circuit elements on a lateral side thereof and which has an opposite lateral face substantially covered by a metallic cooling sheet.

This structure provides additional advantages beyond those obtained with conventional single-in-line modules which do not have the additional cooling means of being able to better cool the circuit module, particularly the integrated semiconductor circuit element and/or other circuit elements, for example, resistance tracks or resistance surfaces so that the circuit module and/or its components can be loaded even more heavily with current and more effectively dissipate heat. A further advantage over conventional structures is that the circuit module constructed in accordance with the principles of the present invention is made even more mechanically stable by the presence of the cooling sheet and thus is better able to add mechanical stability to the circuit board in which it is inserted. The additional mechanical strength provided by the cooling sheet also adds to the ability of the module to be loaded with higher current-drawing elements. A further advantage is that the cooling sheet provides improved electrical shielding between neighboring circuit modules which are inserted in the circuit board next to one another. The metallic cooling sheet is preferably grounded for this purpose.

Specifically, the presence of the metallic cooling sheet at one lateral surface of the circuit module stiffens the circuit module in the direction along the row of metal terminal pins and thus minimizes torsion and flexural stresses which may occur in carriers such as, for example, ceramic carriers which are sensitive to such stresses.

In one embodiment of the invention, an insulating sheet is disposed between the cooling sheet and the lines and/or components to be cooled, although the cooling sheet may be employed without the use of such an insulating sheet.

The present invention is also applicable for carriers which for particular circuit needs may be thicker than normal carriers consisting of, for example, circuit board material or glass. In this situation, the thickness of the carrier severely limits heat dissipation from one lateral surface of the carrier to the lateral surface line opposite thereto, so that the presence of the metallic cooling sheet permits heavier current use and component density than was heretofore possible with such relatively thick carriers.

The cooling sheet further improves the mechanical stability of the circuit module by reducing internal tensile and compressive stresses caused in the carrier due to nonuniform thermal distribution and thus reduces warping of the carrier due to non-uniform expansion in the interior thereof.

In one embodiment of the invention, the cooling sheet is in the form of a plate having a largest portion attached to a lateral surface of the carrier in a plane which is parallel to the plane containing the carrier and the terminal pins, and has an angled portion which extends perpendicular to the main portion of the cooling sheet. In a further embodiment, the sheet has a plurality of ribs which extend parallel to the angled portion away from the carrier to provide additional cooling surfaces. In a further embodiment of the invention, a plurality of comb-like projections are provided at each end of the cooling sheet which also extend perpendicularly from the main portion of the cooling sheet.

In another embodiment of the invention, the angled portion of the cooling sheet extends above other discrete components which are mounted in the circuit board to which the circuit module is also mounted, and provides improved electrical shielding for those components.

Another embodiment of the invention also includes a portion of the cooling sheet which extends a distance outwardly from the circuit module for shielding other discrete components on the circuit board, with the extended portion of the cooling sheet being movable so as to provide easy access to the components shielded thereby without the necessity of removing the entire circuit module. In one variation of this embodiment, the movement of the extended portion of the cooling sheet is permitted by a hinge connecting the main portion of the cooling sheet with the portion thereof which extends above the discrete components. In another variation, the extended portion of the cooling sheet carries a leaf-spring clamp on one end thereof which engages a small flange on the main portion of the cooling sheet which is attached to the circuit module. In another variation, the extended portion of the cooling sheet and the main portion of the cooling sheet which is attached to the circuit module each have small flanges at mating edges, and a pair of small clamps are secured at opposite sides of the joined portions to hold the portions together. In a further variation, the extended portion of the cooling sheet is held in place with respect to the main portion of the cooling sheet by a clamp which extends along the entire length of the cooling sheet which engages in the manner of a safety pin to clamp the two portions of the cooling sheet together.

DESCRIPTION OF THE PREFERRED EMBODIMENTS

Figure 1:
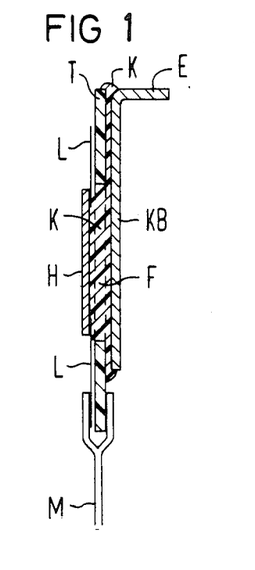
FIG. 1 is a sectional view of a housing-free vertically insertable single-in-line circuit module constructed in accordance with the principles of the present invention having a window in the carrier and a horizontal continuation of the cooling sheet.
Figure 2:
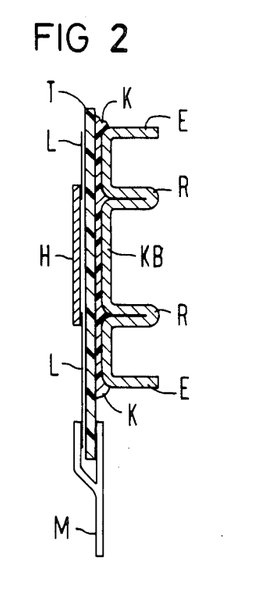
FIG. 2 is a sectional view of a second embodiment of the invention with cooling ribs.

A basic embodiment of a housing-free vertically insertable single-in-line circuit module is shown in section in FIG. 1. The module consists of a carrier T which may consist, for example, of synthetic film or ceramic. The carrier T carries a series of metal pins M disposed in the plane of the carrier T which serve as external terminals for the module by which the module can be vertically inserted in a circuit board. The carrier T carries one or more lines or circuit runs L as well as electrical components including at least one integrated housing-free semiconductor circuit element H. The carrier T may carry in addition to the semiconductor element H, or in place thereof, one or more meandering resistance tracks or one or more resistance surfaces. In accordance with the principles of the present invention, the embodiment shown in FIG. 1, as well as all embodiments described below, have a metallic cooling sheet KB which has a portion thereof which substantially covers one lateral surface of the carrier T. As used herein, the term "substantially covers" means that the cooling sheet KB covers more than half of the lateral surface of the carrier T. The cooling sheet KB which may be in the range of, for example, 0.2 through 0.8 millimeters in thickness can float electrically or can be applied to a constant potential such as, for example, to ground. The cooling sheet can be secured to the carrier T by any known manner such as, for example, by means of an adhesive K as shown in FIGS. 1 and 2. The cooling sheet KB can be secured to the carrier T by other means such as soldering compounds and/or bonding connections which directly or indirectly provide an attachment to the carrier T.

The cooling sheet KB thus does not form a closed structure, that is, does not form a housing for the component H but instead covers a lateral surface of the circuit module in such a manner that cooling air can readily pass over the cooling sheet KB during operation even when a large number of such circuit modules are inserted in a circuit board in close proximity and parallel to one another. The cooling sheet KB quickly distributes and dissipates heat which arises at a surface of the component H, for example, as well as in the associated lines L, by providing a large cooling surface for dissipation of such localized heating. The cooling sheet KB thus permits improved cooling of the module and the circuit elements thereon and permits elements such as components H and the lines L to be loaded more heavily with current than would be possible in the absence of the colling sheet KB.

The cooling sheet KB has the further structural feature of stiffening the circuit module so that the circuit board into which the module is inserted is also strengthened. The circuit module and the components H thereon can thus withstand a heavier current load without warping or other distortion of the carrier T.

The cooling sheet KB also provides improved electrical screening between neighboring circuit modules inserted in parallel into the circuit board next to one another, particularly when the cooling sheet KB is grounded. The carrier T may be a solid element or may, as is shown in FIG. 1, have a window or aperture F which improves cooling of the circuit element H by means of the cooling sheet KB especially if the carrier T consists of glass or ceramic. It is perferable to fill the window F with adhesive K which is used to attach the cooling sheet KB to the carrier T and it is further preferable to employ an adhesive K which exhibits a relatively low thermal resistance and which may, for example, have metal or ceramic powder mixed therein in order to facilitate such a low thermal resistance. The adhesive K may contact the adjacent surface of the component H which is protected by an insulating lacquer as is known to those skilled in the art. By so doing, the heat dissipation from the component H to the cooling sheet KB and from the cooling sheet KB to the surrounding air is further improved with the component H being applied in too close proximity to the cooling sheet KB in a manner which may increase stray capacitances.

As also shown in FIG. 1, the cooling sheet KB has an angled extension E which extends substantially perpendicular from the plane of the carrier T. The angled leg is bent along a line of the cooling sheet KB which is parallel to the row of pins M. The leg E improves cooling of the circuit module, particularly of the integrated circuit element H, because it enlarges the cooling surface cooled by the surrounding air without significantly increasing the air resistance for flow of the cooling air parallel to the row of pins M. Moreover, the horizontal leg E stiffens the circuit module along the row of pins M to a greater degree than if the sheet KB were completely flat, thus permitting even heavier current loading of the components carried on the carrier T.

The leg E may be disposed on either the side of the sheet KB close to the pins M or the side farther therefrom, as shown in FIG. 1. The embodiment shown in FIG. 1 is preferable because the heat dissipation is improved as a result of the increased flow rate of cooling air along the edge facing away from the pins during operation of the module. Placement of the leg E at this position further permits placement of other components on the circuit board into which the module is inserted which can be shielded by the sheet KB in a manner described below. A horizontal leg E may, however, be applied to both edges of the cooling sheet KB as is shown in FIG. 3.

In all of the further embodiments discussed below, elements identical to those described in connection with FIG. 1 have been identified with identical reference symbols, and individual identification thereof will not be repeated.

A second embodiment of the invention is shown in FIG. 2 wherein the cooling sheet KB has a number of ribs R thereon which extend parallel to the legs E. The ribs R provide an increased cooling surface for the sheet KB and further increase the stiffness of the circuit module in the direction along the row of metal pins M, thus permitting even heavier current loading and power dissipation.

Figure 3:
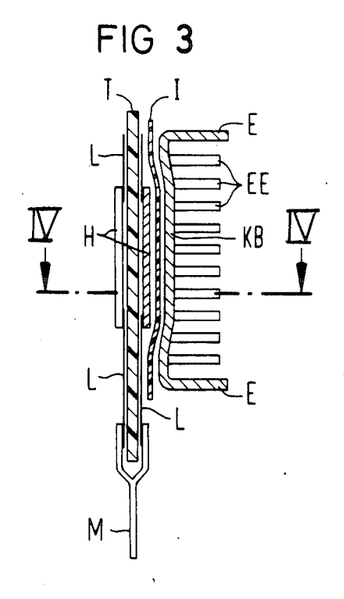
FIG. 3 is a sectional view of a third embodiment of the invention with comb-like continuations of the cooling sheet.
Figure 4:
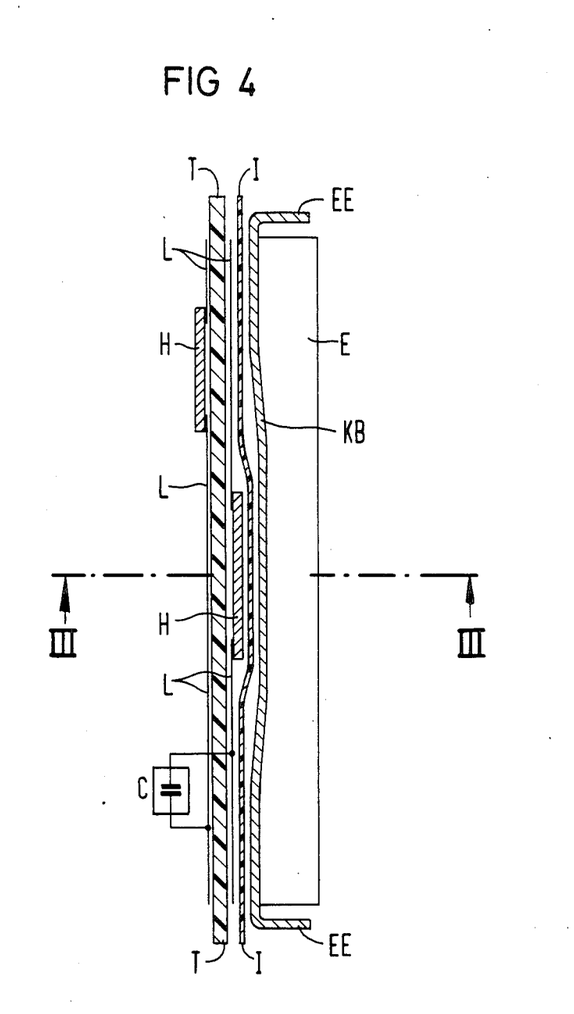
FIG. 4 is a sectional view taken along line IV—IV of FIG. 3.

A third embodiment is shown in FIG. 3 in which the sheet KB has additional angled comb-shaped extensions or continuations EE along both edges of the cooling sheet KB. The extensions EE are directed perpendicularly with respect to the row of metal pins M, as can be seen in FIG. 4. In this embodiment, the cooling sheet KB is not directly bonded to the lateral face of the carrier T but is instead bonded to an insulating film I which is glued between the sheet KB and the carrier T as an insurance against short circuits. The adhesive is not shown in FIGS. 3 and 4 in order to simplify the figure. The insulating film I may be self-adhesive on both sides thereof which considerably simplifies assembly of the circuit module. The insulating film I may be used in any of the embodiments disclosed herein and is not limited to the embodiment shown in FIGS. 3 and 4.

The comb-like projections EE further increase the cooling sheet surface available for contact with the air flowing over the module and thus permit a particularly improved and rapid cooling of the lines L and component H of the circuit module. In this embodiment, as shown in FIG. 3, the use of the insulating film I permits elements such as the semiconductor component H and the lines L to be disposed on both sides of the carrier T. The cooling sheet KB in this situation greatly aids in heat dissipation from the semiconductor component H which is disposed between the carrier T and the sheet KB, particularly if the carrier T is a relatively poor thermal conductor or is relatively thick. The internal tensile and compressive stresses in the carrier T due to non-uniform heat distribution are also significantly reduced and distortion of the carrier T due to non-uniform expansion thereof is also correspondingly reduced. If the embodiment of the cooling sheet shown in FIG. 3 is used, for example, in the construction of FIG. 1 wherein components are carried only on one side of the carrier T, the insulating film I can be eliminated. Moreover, additional discrete non-integrated components such as a capacitor C as shown in FIG. 4 can be added without interference by the cooling sheet KB.

As shown in FIGS. 3 and 4, the cooling sheet KB possesses a slight arc in the central portion of the lateral face of the carrier T, so that unevenness caused by the presence of the component H is approximately compensated. This arc can be made smaller or eliminated if the insulating film I is made relatively thick and has a window or aperture in the area of the covered semiconductor element H, so that the insulating film I covers only the lines L on the lateral surface of the carrier T and the film thus levels the lateral surface of the circuit module covered by the cooling sheet KB. The presence of the window further improves convection from the semiconductor element H to the cooling sheet KB and short circuits can still be prevented by covering the component H disposed in the insulating film window, as well as a portion of the cooling sheet KB, with a thin lacquer layer. In this construction, it is preferable, but not necessary, to retain a slight air gap between the component H and the sheet KB.

The insulating film I has the further structural feature of absorbing and compensating for mechanical stresses between the carrier T and the cooling sheet KB which may arise due to unmatched coefficients of thermal expansion for the carrier material and the cooling sheet material. In the absence of the flexible insulating film I, bending of the circuit module may result in a popping of the cooling sheet KB from the covered lateral surface of the carrier T.

Using this construction, both large lateral surfaces of the carrier T can be covered with separate cooling sheets KB thus achieving even more efficient and rapid cooling of the circuit module and significantly improved stiffening and overall strength of the module permitting heavier current loading for the components carried on the module. The above-mentioned mechanical stresses between the carrier T and the cooling sheet KB resulting from unmatched coefficients of thermal expansion of the two elements can be further eliminated by selecting a material for the carrier T such as an appropriate synthetic which is elastic in comparison to the cooling sheet material, thus minimizing the possibility of the cooling sheet KB popping off of the carrier T in such a situation. This problem can be eliminated altogether by utilizing small spring clamps or other suitable means to attach the cooling sheet KB to the carrier T of the type discussed in conjunction with other embodiments described below.

Figure 5:
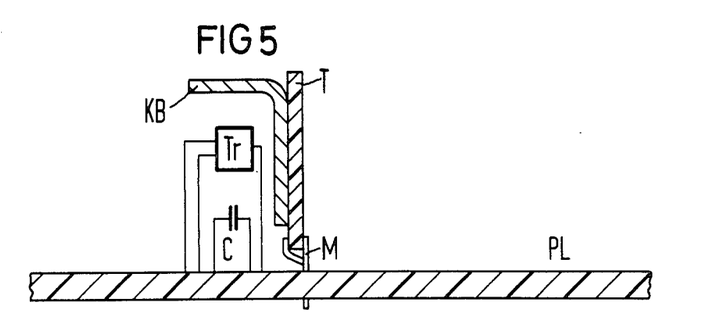
FIG. 5 is a sectional view of a fourth embodiment of the invention with an angled cooling sheet for covering adjacent discrete components.

In a fourth embodiment of the invention shown in FIG. 5, the horizontal portion of the cooling sheet KB is extended a greater distance than in the earlier embodiments so as to provide an improved shield for discrete components which are also inserted on a circuit board PL into which the module is inserted, such as a capacitor C and a transistor Tr. The angled L-shaped cooling sheet KB shown in FIG. 5 provides such shielding in a space-saving manner which permits a large number of such circuit modules to be attached directly next to one another on the circuit board PL.

The embodiment of FIG. 5 has the drawback that the rigid horizontal extension of the cooling sheet KB hinders repair and inspection of the discrete components disposed beneath it. It is the object of the remainder of embodiments discussed herein to provide a cooling sheet which retains all of the advantages discussed above and which permits access to discrete components which may be disposed beneath the cooling sheet. In the embodiment shown in FIG. 6, this object is achieved in a hinged cooling sheet comprised of a vertical portion KB1 and a horizontal portion KB2 which are engaged at a hinge SC permitting the horizontal portion KB2 to move from a normal shielding position shown at the left of FIG. 6 to a substantially vertical position, which permits access to components which may be disposed to the right of the module. The module, including the legs KB1 and KB2, may be covered with a protective lacquer SL, as may all other embodiments disclosed herein.

Figure 6:
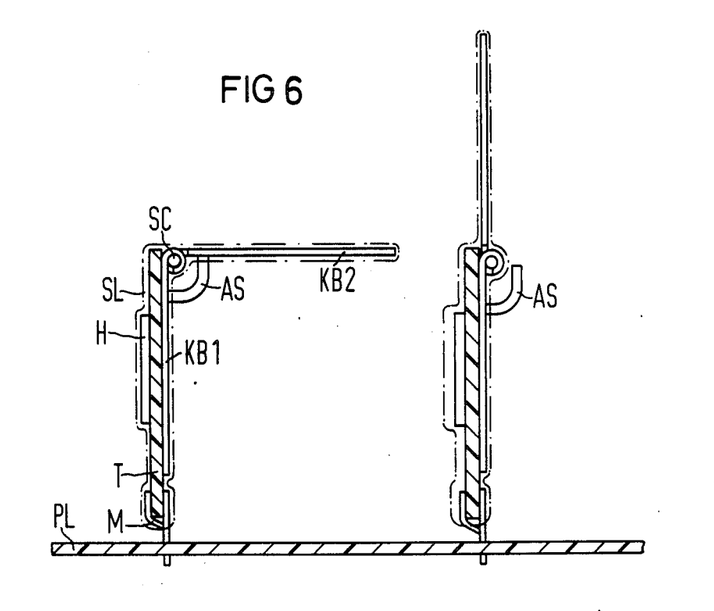
FIG. 6 is a sectional view of a fifth embodiment of the invention with a hinged angled cooling sheet shown in vertical and horizontal positions.

The horizontal leg KB2 of the cooling sheet may be maintained in perpendicular position with respect to the vertical leg KB1 by a number of means. The hinge SC may be of the type which has a sufficiently large internal friction to retain the leg KB2 in whichever position is desired. A lacquer drop can also be applied to the hinge SC which hardens to retain the leg KB2 in a horizontal position, but which can be easily broken for pivoting the leg KB2 to the vertical position, followed by application of another drop after the leg KB2 is returned to the horizontal position. Another means, as is shown in FIG. 6, is a detent AS integrally formed from the vertical leg KB1, which supports the horizontal leg KB2. In the embodiment shown in FIG. 6 the detent AS is constructed so as to support the leg KB2 at a position which is 90° relative to the leg KB1, however, it will be understood that the detent As may be of any size to allow the leg KB2 to rest at any intermediate angle with respect to the leg KB1.

Figure 7:
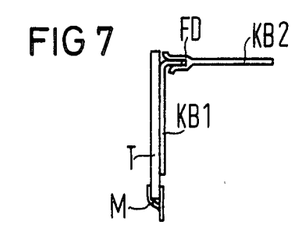
FIG. 7 is a sixth embodiment of the invention with a horizontal section of the cooling sheet having a leaf spring clamp.
Figure 8:
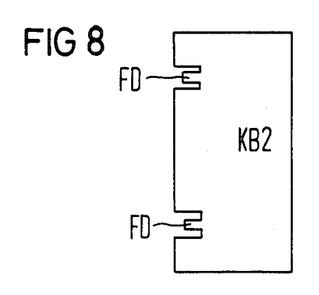
FIG. 8 is a plan view of a removable horizontal portion of the cooling sheet for a seventh embodiment of the invention.
Figure 9:
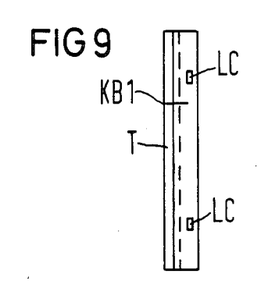
FIG. 9 is a plan view of a vertical portion of the cooling sheet for receiving the removable portion shown in FIG. 8.

Another embodiment is shown in FIG. 7 in which the horizontal leg KB2 is attached to the vertical leg KB1 by means of a leaf spring clip FD which is carried along one edge of the leg KB2, and which engages a short lateral extension of the leg KB1. The position of the leg KB2 can be further maintained by applying a drop of hardenable lacquer to the spring clip FD. In a variation of the embodiment shown in FIG. 7, the clips FD may engage depressions or holes LC carried in the short rib of the leg KB1, as is shown in FIGS. 8 and 9.

Figure 10:
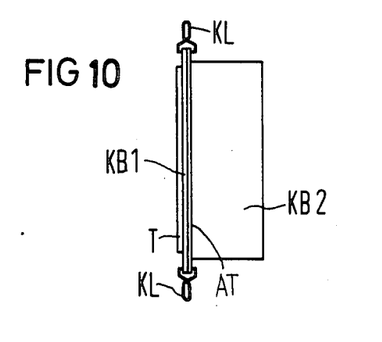
FIG. 10 is a plan view of horizontal and vertical portions of the cooling sheet in an eighth embodiment held in engagement by two spring clips.
Figure 11:
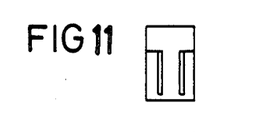
FIG. 11 is a plan view of one of the spring clips shown in FIG. 10.
Figure 12:
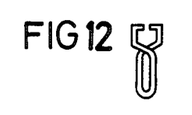
FIG. 12 is a side view of one of the spring clips shown in FIG. 10.

In the embodiment shown in FIG. 10, the horizontal leg KB2 has an angled projection AT, which is placed adjacent to the vertical leg KB1 and is clamped thereto by means of two small spring clamps KL. The clamps are constructed of one-piece resilient material and are shown (enlarged) in two views in FIGS. 11 and 12. As in the previous embodiments, the clamps KL may be locked in place by means of a lacquer drop.

As stated above, all of the embodiments disclosed herein may be completely covered with a protective lacquer SL shown by way of example in the embodiment of FIG. 6. It is preferable if the lacquer is of a dark color, such as black, because such a colored lacquer will radiate heat better than a light color or a metallic surface.

In the above and following embodiments in which a portion of the cooling sheet KB is movable or removable, the cooling sheet is comprised of metal, as in the initial embodiments, and is grounded and attached to one lateral surface of the carrier T in such a manner that it substantially, if not completely covers the carrier T at that surface. In fact, the cooling sheet KB may be of a greater area than the carrier T and project beyond the carrier T at the edges or at least at a portion thereof.

In the embodiment shown in FIG. 6, the cooling sheet remained in place adjacent to the carrier T, but was hinged to permit access to adjacent discrete components. In the embodiment shown in FIGS. 7 through 12, the horizontal portion of the cooling sheet was completely removable to also permit such access. In the embodiment shown in FIGS. 13 through 18, the entire cooling sheet, including the vertical portion, is removable from the carrier T for permitting access to adjacent discrete components.

Figure 13:
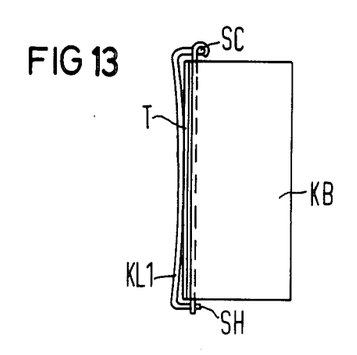
FIG. 13 is a plan view of horizontal and vertical portions of the cooling sheet in a ninth embodiment held in engagement by an elongated hinged clamp.

In the embodiment shown in FIG. 13, the cooling sheet KB is L-shaped and has a hinge SC at one side thereof at which an elongated clamp KL1 pivots. At the end opposite the hinge SC, the elongated clamp KL1 engages a snap mechanism SH which is firmly attached to the cooling sheet KB. In order to improve the pressure of the elongated clamp KL1 against the carrier T, the clamp is of resilient material and has an arc therein such that when the end of the clamp KL1 is engaged in the snap mechanism SH, the central portion of the clamp KL1 substantially rests against the carrier T at that side thereof opposite to the cooling sheet KB. The snap mechanism SH may be, for example, similar to that of a household safety pin.

Figure 14:
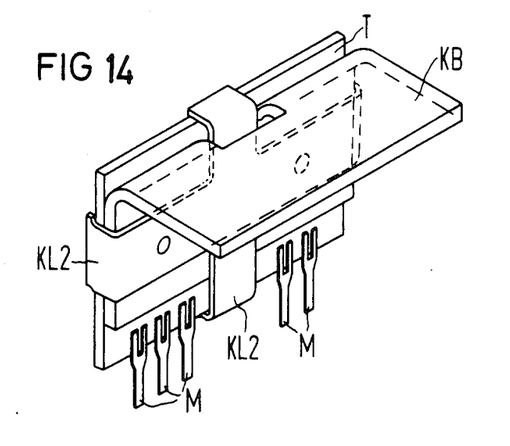
FIG. 14 is a perspective view of an angled cooling sheet held against the carrier in a tenth embodiment with a cross-shaped clip.
Figure 15:
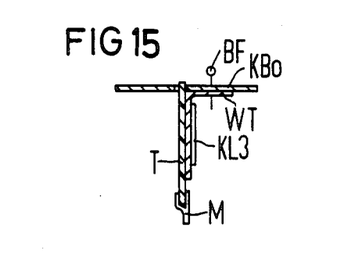
FIG. 15 is a sectional view of an eleventh embodiment of the invention wherein the cooling sheet is held in a receptacle formed between the carrier and a clamp attached thereto.
Figure 16:
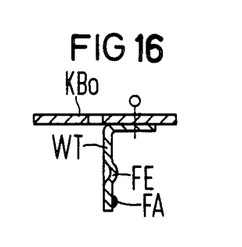
FIG. 16 is a sectional view of the cooling sheet in the embodiment shown in FIG. 15.
Figure 17:
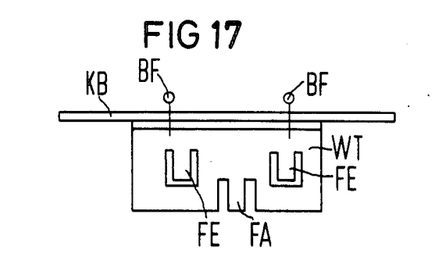
FIG. 17 is a front view of the cooling sheet in the embodiment shown in FIG. 15.
Figure 18:
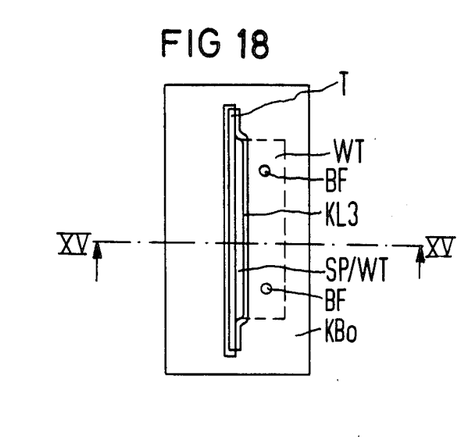
FIG. 18 is a plan view of the cooling sheet in the embodiment shown in FIG. 15.

In the embodiment shown in FIG. 14, the one-piece cooling sheet KB is held against the carrier T by a clamp KL2 which has four claws respectively engaging the edges of the carrier T. The clamp KL2 is attached to the cooling sheet KB by rivets or other suitable means. The claws of the clamp KL2 are resilient so that the clamp-and-cooling sheet assembly can be easily attached and removed. In the embodiment shown in FIGS. 15 through 18, the cooling sheet is held adjacent to the carrier T by a clamp KL3 which is attached to the carrier T at its ends and which has a raised central portion so as to create a gap SP between the clamp KL3 and the carrier T. The clamp KL3 is resilient and slightly arced toward the carrier T so that the portion of the cooling sheet inserted into the gap SP is pressed against the carrier T and held in place. The cooling sheet is further maintained in position by resilient tongues FE and FA integrally formed therein by means of stamping which engage corresponding notches in the central portion of the clamp KL3. In this embodiment, the cooling sheet is of an overall T-shape, and is comprised of two parts which are secured together in non-removable fashion by attachment means BF, which may be, for example, screws, rivets, spot welding, or any other suitable means known to those skilled in the art. The cooling sheet is comprised of a horizontal portion KBo which is a generally flat element, and a lower portion WT, which is L-shaped. It is the lower portion WT which is inserted in the gap SP and which substantially covers one lateral surface of the carrier T.

In the above discussion, the term "cooling" has been used to mean not only dissipation of heat by providing a large surface for contact with air flowing over the circuit module, but also is intended to include heat dissipation resulting from distribution of localized high temperatures so that no one portion of the cooling sheet remains of a significantly higher temperature than any other part.

Although modifications and changes may be suggested by those skilled in the art, it is the intention of the inventors to embody within the patent warranted hereon all changes and modifications as reasonably and properly come within the scope of their contribution to the art.

We claim as our invention:

1. A circuit module, which is housing-free and is connected into a circuit board to extend vertically thereto, said module comprising a flat carrier of an insulating material and having a pair of planar lateral surfaces, a plurality of stiff metal terminal pins being permanently attached along one edge of said carrier to form a single row of stiff terminal pins extending comb-like in a plane parallel to the lateral surfaces of the carrier from said one edge, at least one integrated housing-free circuit element carried on said carrier and at least one conductor run connecting said circuit element to at least one of said plurality of terminal pins, metallic grounded cooling sheet having a first portion and a second portion extending at substantially a right angle to said first portion, and bonding means securing the first portion of the cooling sheet to one of the pair of lateral surfaces of the carrier with the first portion substantially covering the one lateral surface and the second portion being along a second edge of the carrier opposite said one edge and extending outwardly from the one lateral surface to form a unitary module with an L-shaped configuration so that said module is mounted on the circuit board solely by means of said single row of stiff terminal pins to form a unitary free standing module with the second portion extending substantially parallel to the circuit board surface.

2. The circuit module of claim 1 wherein said carrier is comprised of a synthetic material having an elasticity which is more elastic in comparison to the elasticity of said metal cooling sheet.

3. A circuit module according to claim 1 wherein said second portion is a separate member from said first portion and said cooling sheet includes means for connecting said first and second portions together and permitting relative movement therebetween.

4. A circuit module according to claim 3, wherein said means for connecting is a hinge.

5. A circuit module according to claim 4, which include a detent for limiting movement between said portions in one direction around the hinge to a fixed angle therebetween.

6. A circuit module according to claim 3, wherein said means for connecting form a plug connection between said portions.

7. A circuit module according to claim 6, wherein said means for connecting include a projection on the first portion receiving a clamp provided on the second portion.

8. A circuit module according to claim 1, wherein said bonding means comprises a layer of adhesive disposed between the one lateral surface and the one portion of the cooling sheet.

9. The circuit module of claim 8 wherein said adhesive contains a metallic powder.

10. The circuit module of claim 8 wherein said adhesive contains a ceramic powder.

11. A circuit module according to claim 1, wherein said circuit element is a resistance layer on a lateral surface of the carrier.

12. A circuit module according to claim 1, wherein the first portion has at least one cooling rib extending parallel to said second portion.

13. A circuit module according to claim 12, wherein said first portion along an edge extending perpendicular to said second portion has a plurality of projections in a row to form a comb-like arrangement extending perpendicular to the plane of the carrier.

14. A circuit module according to claim 1, wherein said first portion along an edge extending perpendicular to said second portion has a plurality of projections extending in a row to form a comb-like arrangement extending perpendicular to the plane of the carrier.

15. A circuit module according to claim 1, wherein at least one said circuit element and at least one conductor run are disposed on the other lateral surface of the pair of lateral surfaces.

16. A circuit module according to claim 1, wherein at least one circuit element and conductor run are mounted on the one lateral surface.

17. A circuit module according to claim 16, wherein the cooling sheet has a recess for receiving the circuit element.

18. A circuit module according to claim 17, wherein the circuit element received in the recess is covered by a protective layer.

19. The circuit module of claim 16 further comprising an insulating film disposed between said cooling sheet and said circuit element and run.

20. The circuit module of claim 1 further comprising a dark protective lacquer covering said entire circuit module for improving the heat dissipation properties thereof.

* * * * *